United States Patent [19]

Ohta et al.

[11] Patent Number: 4,719,152
[45] Date of Patent: Jan. 12, 1988

[54] TRANSPARENT CONDUCTIVE LAYER BUILT-UP MATERIAL

[75] Inventors: Tatsuo Ohta; Mayumi Okasato; Hideo Watanabe, all of Hino, Japan

[73] Assignee: Konishiroku Photo Industry Co., Ltd., Tokyo, Japan

[21] Appl. No.: 778,565

[22] Filed: Sep. 20, 1985

[30] Foreign Application Priority Data

Sep. 21, 1984 [JP] Japan .................. 59-198155
Sep. 21, 1984 [JP] Japan .................. 59-198156

[51] Int. Cl.$^4$ .............. B32B 15/00; B32B 7/02; B32B 9/00; H01J 1/62
[52] U.S. Cl. .................. 428/432; 428/212; 428/690; 428/917; 313/503; 313/506
[58] Field of Search ............. 428/1, 212, 432, 690, 428/691, 917; 313/503, 506

[56] References Cited

U.S. PATENT DOCUMENTS

| | | |
|---|---|---|
| 2,919,212 | 12/1959 | Gasser .................. 117/215 |
| 4,140,937 | 2/1979 | Vecht et al. ............ 313/503 |
| 4,336,119 | 6/1982 | Gillery ................. 204/192 P |
| 4,379,040 | 4/1983 | Gillery ................. 204/192 P |
| 4,585,689 | 4/1986 | Ohta et al. ............. 428/216 |

Primary Examiner—John E. Kittle
Assistant Examiner—Patrick J. Ryan
Attorney, Agent, or Firm—Jordan B. Bierman

[57] ABSTRACT

The transparent conductive layer-built-up material based on the present invention, since it is of the construction that, in a transparent conductive layer-built-up material comprising a base having thereon at least a transparent conductive layer comprised principally of an oxidized product, the transparent conductive layer has on the obverse side thereof a metal or a surface layer containing a metal oxide whose oxidation rate is lower than the intrinsic oxidation rate of the transparent conductive layer, exhibits a high adhesive strength when made adhere to, e.g., the luminescent light-emitting layer of a luminescent display unit and adequately satisfactory sheet resistance and light-transmissivity values, thus showing very excellent characteristics as of a transparent conductive layer-built-up material. Accordingly, if the transparent conductive layer-built-up material based on this invention is used as the transparent conductive layer-built-up material for, e.g., an electroluminescent display unit, the displayed pattern is excellent in the luminance as well as in the contrast, and thus a clear image can be obtained.

11 Claims, 23 Drawing Figures

TRANSPARENT CONDUCTIVE LAYER BUILT-UP MATERIAL

BACKGROUND OF THE INVENTION

The present invention relates to a transparent conductive layer built-up material, and more particularly to a transparent conductive layer built-up material suitably usable, particularly, for electroluminescent display units.

Transparent conductive films or transparent conductive layer-built-up materials are extensively utilized in the electric or electronic field; for example, they are utilized as the electrode for liquid crystal display units, as the electrode for electroluminescent display units, as the electrode for photoconductive photoreceptors, for cathode-ray-tubes, as the static electricity-shield layer in the window section of various measuring instruments, as antistatic layers, as heating elements, and the like. Of these the transparent conductive film having selective light transmissibility, because of its infrared reflectibility, is applied as the collector window material for the untilization of solar energy and as the window material for buildings. Also, with the advance of information processing technology, various solid-state display units, as ones replacing the conventional Braun tubes, have been developed which use electroluminescent materials, liquid crystals, plasma, ferrodielectric substances, etc., and for these display units transparent electrodes are always used. Further, new electrooptical elements and recording materials which utilize the interaction or interconversion between electric signals and light signals are promising for the future information processing technology, and they also need the use of film having both transparency and conductivity. On the other hand, such transparent conductive film is also applicable as the antifogging window glass for motor vehicles, aircraft, etc.; as the antistatic layer for polymer or glass materials; and also as the transparent adiabatic window for preventing the scattering and loss of solar energy.

In recent years, particularly in liquid crystal display units, electroluminescent display units, plasma display units, electrochromatic display units, fluorescent display units, etc., needs of high-grade picture-element display have been raised, and to meet the needs there have been proposed the improvements on the displaying rate of the picture elements and on the display image quality through the formation of picture elements with an electrode comprising a transparent conductive layer and at the same time the formation of a signal application line with a low-resistance electrode comprising a metallic layer.

Conventional electroluminescent display units, however, have been found out to have the disadvantage of emitting uneven luminescent light during their operation because of the inadequately lowered resistance of the electrode and also because of the inadequate adhesive strength between the electroluminescent light emitting layer and transparent conductive layer when both layers are made adhere to each other by a method which will be described hereinafter.

SUMMARY OF THE INVENTION

It is an object of the present invention to provide a transparent conductive layer built-up material which is free from the above-mentioned problems involved in conventional transparent conductive layer-built-up materials and which, even when used as a large-area flat electrode in, e.g., an electroluminescent display unit, exhibits a high light-transmissivity, a high adhesive strength to a luminescent light-emitting layer-provided layer-built-up material, and an adequately satisfactory low sheet resistance.

EFFECT OF THE INVENTION

The transparent conductive layer-built-up material based on the present invention, since it is of the construction that, in a transparent conductive layer-built-up material comprising a base having thereon at least a transparent conductive layer comprised principally of an oxidized product, the transparent conductive layer has on the obverse side thereof a metal or a surface layer containing a metal oxide whose oxidation rate is lower than the intrinsic oxidation rate of the transparent conductive layer, exhibits a high adhesive strength when made adhere to, e.g., the luminescent light-emitting layer of a luminescent display unit and adequately satisfactory sheet resistance and light-transmissivity values, thus showing very excellent characteristics as of a transparent conductive layer-built-up material. Accordingly, if the transparent conductive layer-built-up material based on this invention is used as the transparent conductive layer-built-up material for, e.g., an electroluminescent display unit, the displayed pattern is excellent in the luminance as well as in the contrast, and thus a clear image can be obtained.

BRIEF DESCRIPTION OF THE DRAWINGS

FIGS. 1 through 23 are drawings showing the examples of this invention, wherein

FIGS. 1 and 9 each is a cross-sectional view of a transparent conductive layer-built-up material, FIG. 2 is a graph showing the relations between the oxidation rate, sheet resistance, and light-transmissivity of a transparent conductive layer, FIG. 3 is a spectral atlas obtained by an ESCA analysis of the transparent conductive layer, FIG. 4 is a cross-sectional view showing a method of joining a transparent conductive layer-built-up material with a light-emitting layer-built-up material to make both adhere to each other, FIG. 5 is a cross-sectional view showing a peel test method, FIG. 6 is a graph showing the relation between the oxidation rate of the transparent conductive layer and the adhesive strength of the transparent conductive layer to the light-emitting layer, FIG. 7 is a plan view of a transparent conductive layer-built-up material whose transparent conductive layer is patterned with a given pattern, FIG. 8 is a cross-sectional view as seen in the direction of arrows from the line VIII—VIII of FIG. 7, FIG. 10 is a schematic cross-sectional view of a manufacturing apparatus for producing the transparent conductive layer-built-up material, FIG. 11 is a graph showing the oxidation rate inside the transparent conductive layer, FIG. 12 is a graph showing the relation between the oxidation rate of the transparent conductive layer and the change in the sheet resistance, FIG. 13 is a graph showing the relations between the thickness of the surface layer comprised of a metal (tin), sheet resistance, and light-transmissivity, FIG. 14 shows the ESCA surface analysis data of the transparent conductive layer-built-up material having a surface layer comprised of a metal (tin), FIG. 15 is a graph showing the relation between the tensile distance and peeling load in a peel test, and FIGS. 16, 17, 18, 19, 20, 21, 22 and 23 each is a graph showing the relations between the thickness of the metallic layer, sheet resistance, light-transmissivity, and adhesive strength.

DETAILED DESCRIPTION OF THE INVENTION

The present invention relates to a transparent conductive layer-built-up material which is such that, in a transparent conductive layer-built-up material comprising a base having thereon a transparent conductive layer comprised principally of a metal oxide, the said transparent conductive layer has on the obverse side thereof a surface layer containing a metal or metal oxide whose degree of oxidation is lower than that of the transparent conductive layer.

Figure 1:
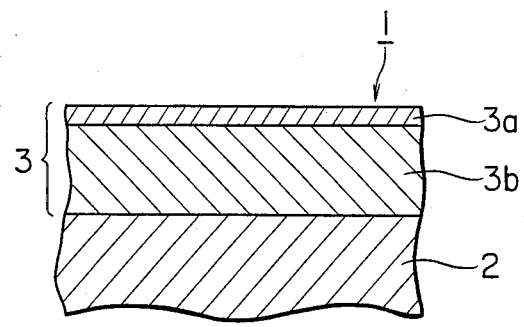

FIG. 1 is a cross-sectional view of an example of the transparent conductive layer-built-up material based on the present invention, wherein transport conductive layer-built-up material 1 is so constructed that on base 2 is formed a transparent conductive layer 3b, which is a layer having the standard oxidation rate as of a transparent conductive layer, and the layer 3b has thereon a surface layer 3a consisting of a layer (comprising a metal layer) whose oxidation rate is lower than that of the layer 3b, the layer 3b and layer 3a being built up on base 2 in the described order from the base side.

Usable materials for the above respective layers are as follows:

Those materials usable for base 2 include polyimide, polyether-sulfone, polysulfone, polyester-type resins such as polyethylene terephthalate, polyethylene-2,6-naphthalene dicarboxylate, polydiaryl phthalate, polycarbonate, aromatic polyamide, polyamide, polypropylene, cellulose triacetate, and the like. These are of course usable in the form of homopolymers or copolymers, and also usable alone or in a blend. Other materials may also be used as long as they are organic highmolecular compounds excellent in the heat resistance. The heatresistant temperature range, although no special restrictions are placed thereon, is preferably not less than 80° C.

The material suitably usable as the transparent conductive layers 3a and 3b, comprised principally of metal oxides, is one that comprises at least one selected from the group consisting of indium oxide, tin oxide, cadmium oxide and antimony oxide, and above all the particularly preferred material is a mixture of indium (In) and tin (Sn), the proportion by weight of both (In : Sn) of which is in the range of preferably from 80:20 to 99:1. In addition to the above, a tin oxide-antimony mixture may also be used. The layers 3b and 3a need not be of the same material.

Further, the material also usable as the surface layer 3a may be a metallic material comprised of at least one selected from the group consisting of indium, tin, cadmium, zinc, titanium, antimony, aluminum, tungsten, molybdenum, chromium, tantalum, nickel, platinum, gold, silver, copper and palladium. The thickness of the surface layer 3a is preferably less than 200 Å.

In producing the transparent conductive layer-built-up material based on this invention, the formation of transparent conductive layer 3b and surface layer 3a, comprised principally of metal oxides, may be made, for example, in the manner that indium, tin, indium-tin alloy, or the oxides of these metals are used as evaporation materials to be deposited by the spattering method or reaction deposition method, or the lower oxides of the above metals are used to be deposited in like manner, and the deposited layer is then subjected to a postoxidation treatment by at least one of the heating oxidation, discharge oxidation and solution oxidation methods or by the spray coating method.

The control of the oxidation rate of the transparent conductive layer 3b on the base side and of the loweroxidationrate transparent conductive layer (surface layer) 3a to be deposited on the layer 3b, in the case of the spattering or reaction deposition method, may be made according to the oxygen content of the reaction gas, and, in the case of the post-oxidation treatment, may be made according to the oxidation treatment time and/or heating temperature.

The surface layer 3a is allowed to be formed by depositing the above metallic materials, as they are, without being oxidized, by either the spattering or reaction deposition method.

These metals, however, when allowed to stand in the air, usually have the surface thereof formed with a several tens Å-thick oxidized coat. For example, it is known that the naturally formed oxidized coat is in the thicknesses of about 20 Å on aluminum, about 10 Å on silver, about 50 Å on tin, and about 40 Å on copper.

Accordingly, the surface metallic layer 3a in this invention has a naturally oxidized coat on the surface thereof, and where the thickness of the coat is not more than 100 Å, the mostly metallic surface layer 3a is under the naturally oxidized condition.

For the formation of the above layers 3b and 3a the method as described in Japanese Patent Application No.188835/1983, which we proposed earlier, is particularly suitable. This method forms a transparent conductive layer in the manner that an oxidizing gas is supplied to lead component materials for a transparent conductive layer onto a base to thereby deposit the component materials in the oxidized form on the base, and during the deposition of the metal oxides the concentration of the gas is relatively raised in the contact portion of the gas with the base or in the proximity of the base.

The progress to the completion of this invention will now be explained.

Firstly, the results obtained by measuring, with the oxidation rate of the transparent conductive layers being varied, the sheet resistance, light-transmissivity, and adhesive strength of the electroluminescent light-emitting layer with the base, will be described.

Figure 2:
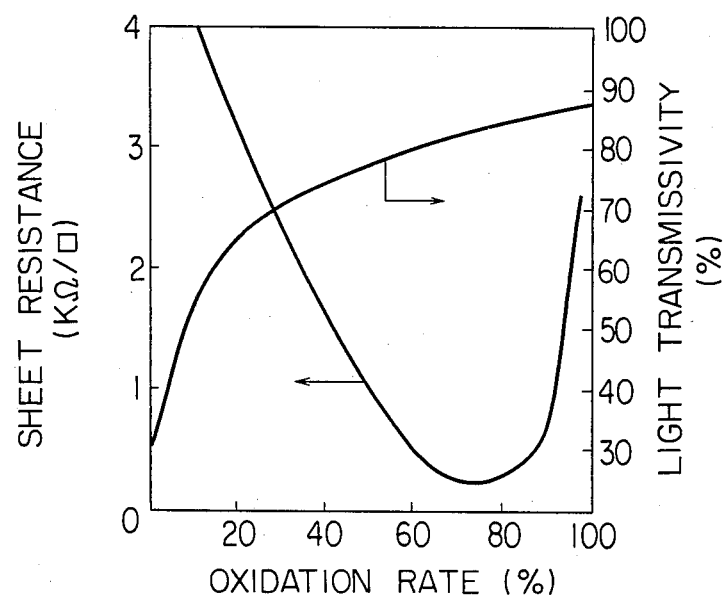

On a base was deposited (in the thickness of 700 Å) an indium oxide-tin oxide mixture (ITO)(indium-tin proportion by weight is 95:5), with the oxidation rate being varied, by the reaction deposition method, thereby preparing a transparent conductive layer-built-up material. The results obtained by measuring the sheet resistance and light-transmissivity of the transparent conductive layer-built-up material are as shown in FIG. 2. The oxidation rate was measured, with the coat being etched, by the ESCA analysis. As the oxidation rate increases the sheet resistance decreases, and once showing the minimum value, the oxidation rate exhibits a rising tendency. On the other hand, the light-transmissivity (light of a wavelength of 550 nm was used; the same will apply hereinafter) increases with the increase in the oxidation rate and becomes more than 70% when the oxidation rate exceeds 33%.

The above oxidation rate, when the composition of the metal oxide is represented by MxOy and the stoichiometrically saturated condition of the above oxide by MxoOyo, is expressed as $(y/x)/(yo/xo) \times 100(\%)$. For example, in the instance of ITO, the principal component material was represented by InxOy and the stoichiometrically saturated condition by $In_2O_3$, and the oxidation rate thereof was obtained from the formula $(y/x)/1.5 \times 100(\%)$.

In the case of tin oxide, the principal component was represented by SnxOy and the stoichiometrically saturated condition by $SnO_2$, and the oxidation rate thereof was obtained from $(y/x)/2.0 \times 100(\%)$.

In the above, the M represents a metallic element such as In, Sn, Pd, Ag, Au, Cr, Al, or the like; the x represents the concentration (atomic %) of the above metallic element; the O is oxygen element; and the y represents the concentration (atomic %) of oxygen element.

Figure 3:
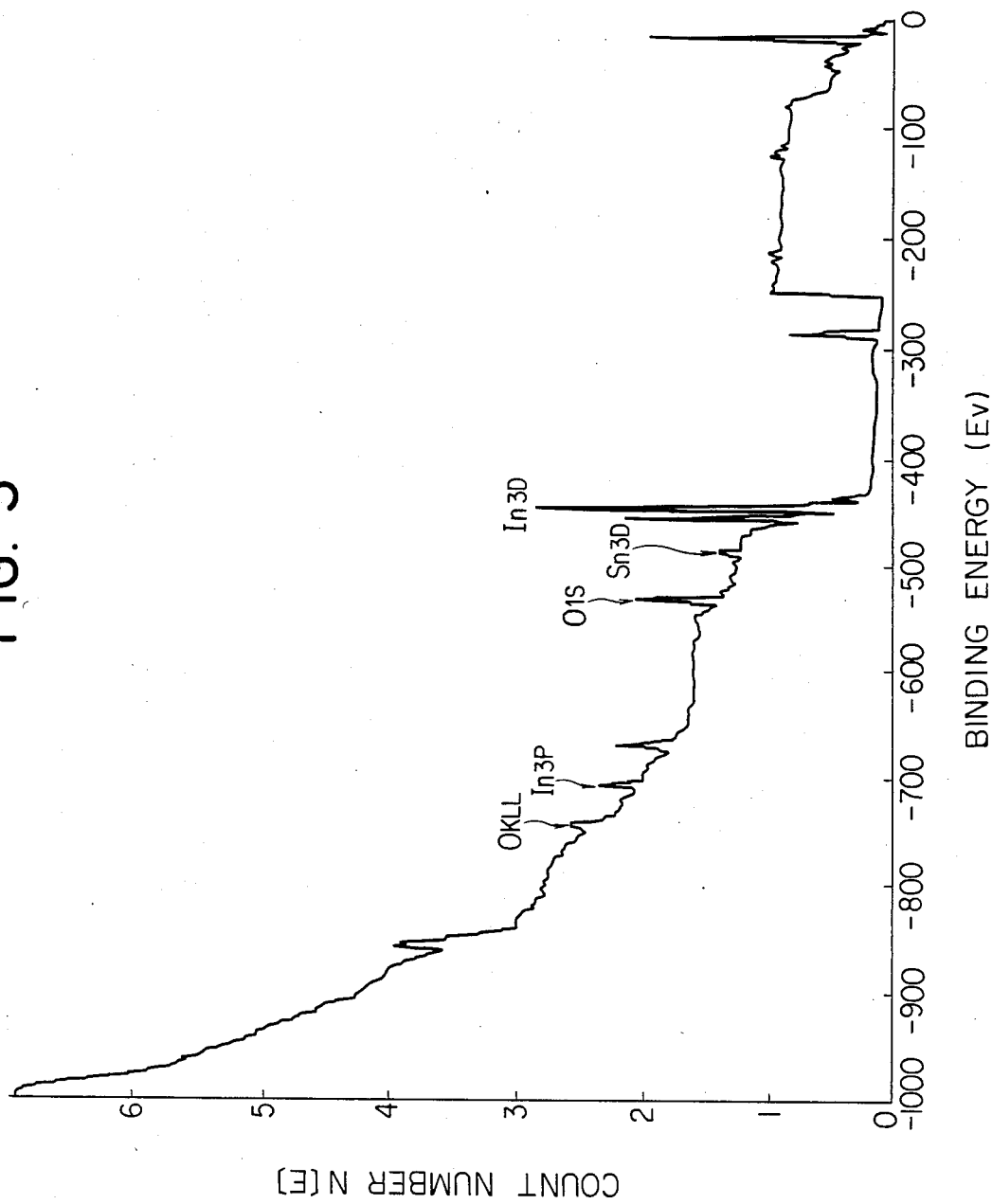

The oxidation rate of ITO was obtained by the calculation made on the basis of the peak ratio of $In_{3D}$ to $O_{1S}$ by the ESCA analysis as shown in FIG. 3. An example of the particular experiment data is given in Table 1. From this the oxidation rate is ($O_{1S}$ concentration/$In_{3D}$ concentration)/$1.5 \times 100 \approx 87\%$. Concentrations of In and O (ITO coat)

The height of each peak was determined from the ESCA data, and divided by an appropriate correction value to thereby obtain a proportion of $In_{3D}:Sn_{3D}:O_{1S}$, and the proportional values were regarded as the respective concentrations (at %) of In, Sn and O.

The concentrations of the Sn and O of $SnO_2$ also were determined from the peak heights of $Sn_{3D}$ and $O_{1S}$ by the same ESCA analysis.

TABLE 1

| | Peak value | (correction value) | Peak value after correction | Concentration (at %) |
|---|---|---|---|---|
| $In_{3D}$ | 2.4 | 2.85 | 0.84 | 42 |
| $Sn_{3D}$ | 0.1 | 3.2 | 0.03 | 2 |
| $O_{1S}$ | 0.7 | 0.63 | 1.11 | 56 |

As seen from FIG. 2, the oxidation rate, which shows the minimum value of the sheet resistance or a value which approximates thereto, is in the range of from about 67 to 87%, and in this oxidation rate range the light-transmissivity shows 82 to 88%. Generally the oxidation rate of the transparent conductive layer is in the above range.

The adhesive strength of the above transparent conductive layer-built-up material to the electroluminescent light-emitting layer will now be explained.

On a 0.2 mm-thick aluminum plate 6 was formed a several-micrometer-thick insulating layer 7 by wire-bar coating and drying a powdery $BaTiO_3$-dispersed resin, and further on this was formed a several-tens-micrometer-thick light-emitting layer 8 by coating and drying a coating liquid prepared by dispersing zinc sulfide and powdery manganese into a cellulose-type resin (in this example, cyanoethylated cellulose was used), whereby a layer-built-up material 5 (see FIG. 4) was prepared.

Figure 4:
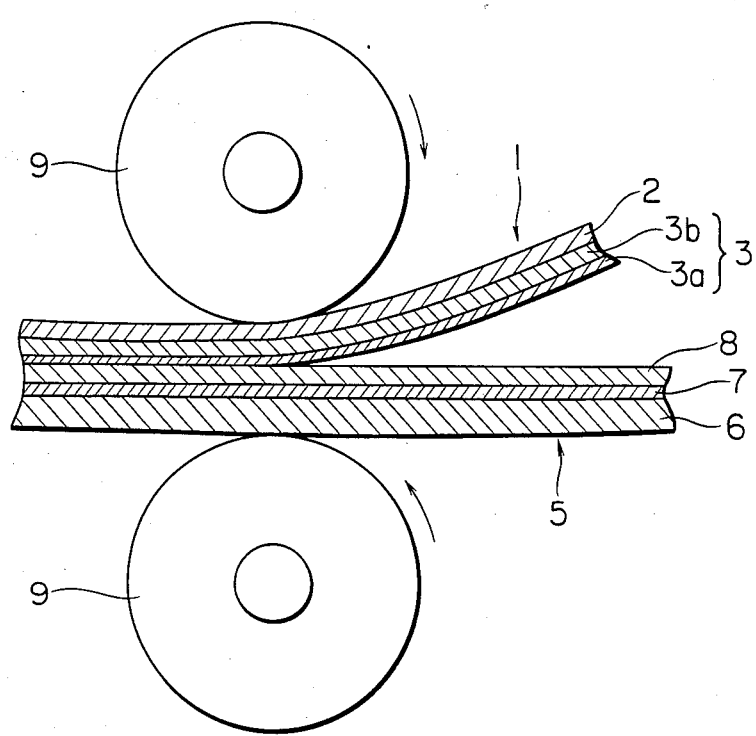

As is indicated in FIG. 4, the light-emitting layer-provided layer-built-up material 5 and the foregoing transparent conductive layer-built-up material 1 comprising base 2 having thereon transparent conductive layers 3 different in the oxidation rate were joined so that the light-emitting layer 8 and the transparent conductive layer 3a come into contact with each other, and both materials were pressed by heat rollers 9 to be made adhere to each other to become an integrated unit, thus producing an electroluminescent display unit, provided that the roller pressure applied is 1 kg/cm, the roller temperature is 150° C., and the width of both the transparent conductive layer-built-up material and the light emitting layer-provided layer-built-up material is 2.5 cm.

Figure 5:
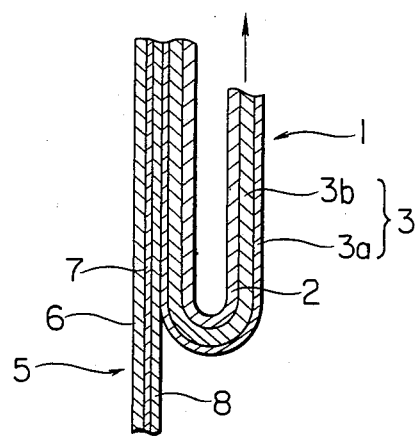

The thus obtained electroluminescent display unit was tested with respect to the adhesive strength of the sticked portion thereof by use of a "Tensilon UTM-III" 180° Peel Tester, manufactured by Toyo Measuring Instrument Co., Ltd. The outline of this test, as shown in FIG. 5, is such that with an end of the light emitting layer-provided layer-built-up material 5 being fixed, the transparent conductive layer-built-up material 1 is pulled in the 180° direction to peel both the materials apart to thereby find the tensile distance and the load required for the peeling; i.e., the relation between the tensile distance and the adhesive strength. The results are as given in Table 2.

TABLE 2

| Oxidation rate (%) | 0 | 13 | 33 | 53 | 67 | 80 | 100 |
|---|---|---|---|---|---|---|---|
| Adhesive strength (g/2.5 cm) | 280 | 275 | 210 | 180 | 150 | 102 | 98 |

Figure 6:
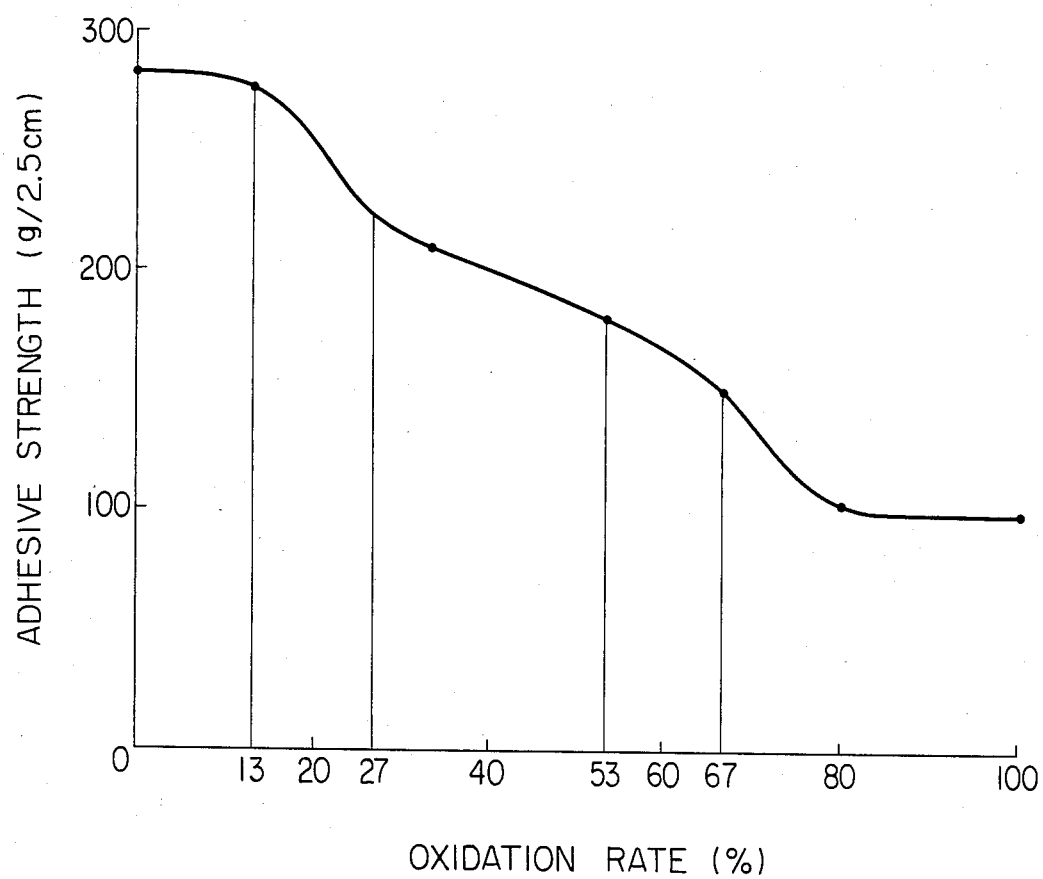

From the above table it is understood that the lower the oxidation rate of the transparent conductive layer, the higher the adhesive strength thereof to the light emitting layer, and when the oxidation rate is lower than 67%, an adhesive strength of not less than 150 g/2.5 cm can be retained, and if the oxidation rate exceeds 80%, the adhesive strength goes down to about 100 g/2.5 cm. Accordingly, from the adhesive strength to the light emitting layer point of view, the oxidation rate of the transparent conductive layer of the transparent conductive layer-built-up material is desirable to be as much lower as possible. Also, from Table 2 and FIG. 6 wherein the data of the table were plotted it is understood that the above oxidation rate is desirable to be less than 67% where the adhesive strength begins to abruptly go down, and more preferably more than 13% where the rise of the adhesive strength due to the lowering of the oxidation rate becomes moderate and less than 67%, and particularly preferably in the range of from 27% to 53%, the range being where the curve's inclination is gentle and the change in the adhesive strength due to the change in the oxidation rate is small.

On the other hand, because, as stated above, the lower the oxidation rate of the transparent conductive layer, the worse the sheet resistance and light-transmissivity of the transparent conductive layer-built-up material, on the base 2 side, as shown in FIG. 1, is provided a transparent conductive layer 3b, which has an oxidation rate of from 67% to 87% and satisfactory sheet resistance and light-transmissivity, and on the layer is further provided a transparent conductive surface layer 3a, whose oxidation rate is lower than that of the layer 3b, whereby a transparent conductive layer-built-up material having a strong adhesive strength to the light emitting layer-provided layer-built-up material can be obtained. This low-oxidation-rate surface layer 3a, if not thick to excess, for example, if not more than 200 Å, will not be deteriorated substantially in the sheet resistance as well as in the light-transmissivity.

The present invention has been made on the basis of the above view and knowledge.

Figure 7:
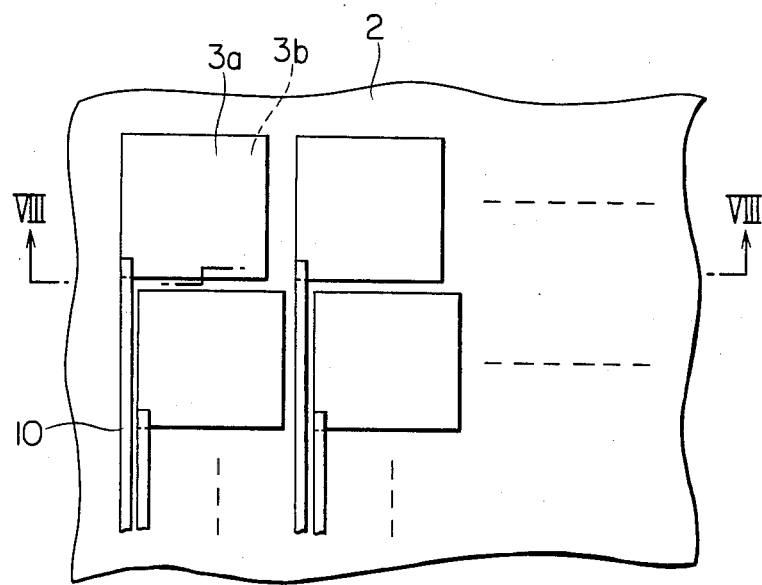
Figure 8:
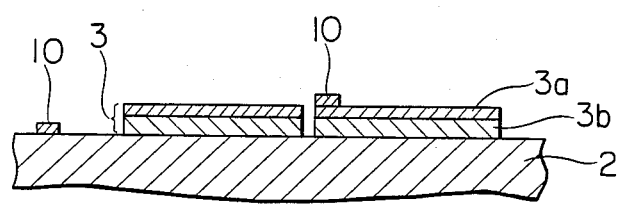

FIG. 7 is a plan view showing an example of the patterned transparent conductive layer-built-up material. FIG. 8 is a cross-sectional view as seen in the direction of arrows from the line VIII—VIII of FIG. 7. On an insulating transparent substrate (base) 2 are arranged in a given pattern a plurality of transparent conductive layer units 3 comprised of transparent conductive layer 3b of a standard oxidation rate (e.g., 67% to 87%) and layer 3a thereon, whose oxidation rate is less than that of the layer 3b, and from the top of an end of each picture element is extended a wiring 10, formed, e.g., by printing a silver paste, over the base 2 toward an end thereof.

Normally, a transparent conductive layer-built-up material is desired to have the characteristics that the light-transmissivity is not less than 60% (preferably not less than 80%) at a wavelength of 550 nm (the same will apply hereinafter), the sheet resistance is not more than 1.5 kΩ/□ (preferably not more than 1000Ω/□), and the adhesive strength to the light emitting layer-provided layer-built-up material is not less than 200 g/2.5 cm (the expression of the adhesive strength will be mentioned hereinafter). By the application of the above construction the transparent conductive layer-built-up material of this invention can adequately satisfy these needs.

Examples of the present invention will be illustrated below:

EXAMPLE 1

Figure 9:
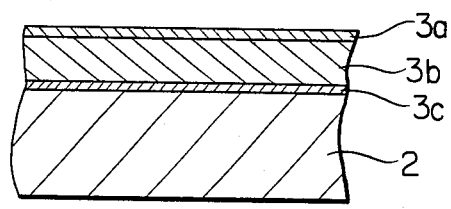

As is shown in FIG. 9, on a 75 μm-thick polyethylene terephthalate roll film base 2 were deposited three transparent conductive layers 3c, 3b and 3a(surface layer), the oxidation rate of which layers was successively degraded, to thereby prepare a transparent conductive layer-built-up material.

Figure 10:
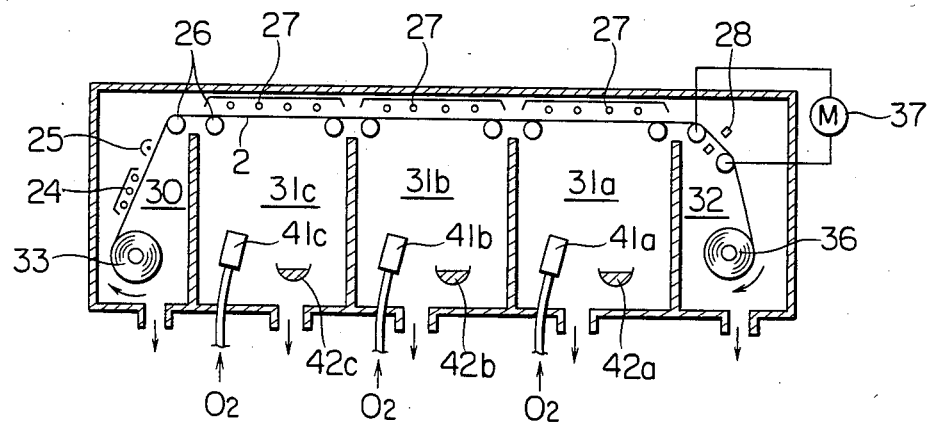

The evaporator for the deposition used in the preparation of the above material is of the construction which is schematically shown in FIG. 10.

The evaporator is partitioned into five compartments 30, 31c, 31b, 31a and 32, of which both extreme-side compartments 32 and 30 have thereinside a take-up roll 36 and supply roll 33, respectively, and the sheet base 2 is continuously transported between both rolls and undergoes the following treatments in the course of the transport. Firstly, in the compartment 30, the base 2 is preheated (at 60° C.) by a heater lamp 24 thereby to be dehydrated; undergoes discharge treatment by a discharge treatment device 25 thereby to be cleaned; and the base 2, which has entered compartment 31c as a first evaporation cabinet, is then subjected to the following treatments in the course of being sent by transport rollers 26 (at a transport rate of 10 cm/min to 2 m/min). Under the heat of halogen heater lamps 27 an evaporation source 42 comprising In-Sn alloy or ITO (or two separate sources of In and Sn) is thermally evaporated and at the same time an oxygen gas is ionized or activated by and conducted through a discharge means 41c into the compartment to thereby deposit a first transparent conductive layer (the above-mentioned 3c) on one-side surface of the base 2.

The base 2 is then transported to the compartment 31b as a second evaporation cabinet, where a second transparent conductive layer (the above-mentioned 3b) is deposited in the same manner as the above on the first transparent conductive layer 3c.

The base 2 is subsequently brought to the compartment 31a as a third evaporation cabinet, where a third transparent conductive layer (the above-mentioned 3a) is deposited in the same manner as the above on the second transparent conductive layer 3b.

The evaporation/deposition conditions are as shown in the following Table 3.

TABLE 3

| | Oxygen gas pressure | High-frequency discharge power | Evaporation material | Thickness |
|---|---|---|---|---|
| Evaporation cabinet 31c | $8 \times 10^{-4}$ torr | 400 W | ITO (Sn 5%) Electron-gun heating | 100Å |
| Evaporation cabinet 31b | $7.5 \times 10^{-4}$ torr | 400 W | ITO (Sn 5%) Electron-gun heating | 600Å |
| Evaporation cabinet 31a | $5 \times 10^{-4}$ torr | 300 W | In resistance heating | 100Å |

Thus, the three-transparent-conductive-layer-deposited base 2 is led to the compartment 32, with its light-transmissibity being measured by a light-transmission-type sensor 28 and with its electric resistance being measured by a resistance measuring instrument 37, is successively wound around the take-up roll 36.

Figure 11:
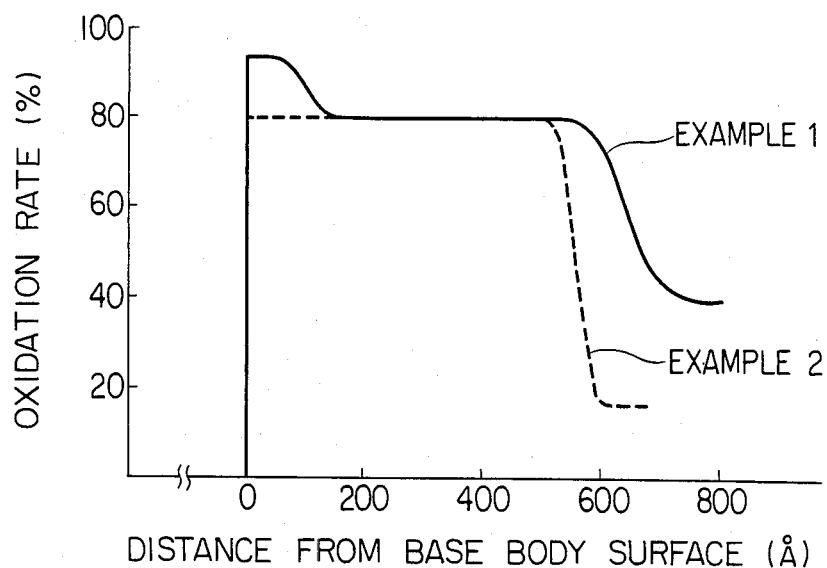

The respective oxidation rates of the transparent conductive layers of the thus produced transparent conductive layer-built-up material are 93% for the layer 3c, 80% for the layer 3b and 40% for the layer 3a. The relation between the distance from the base 2 of the transparent conductive layer-built-up material and the oxidation rate is as shown in FIG. 11. In this example, the intrinsic oxidation rate of the transparent conductive layer comprised principally of oxides is 80%, and that of the surface layer is 40%.

The sheet resistance of this transparent conductive layer-built-up material is 300Ω/□, and the light-transmissivity of the same is 83%.

The transparent conductive layer-built-up material was measured in the same manner as previously mentioned with respect to the adhesive strength thereof to the light emitting layer-provided layer-built-up material. The resulting adhesive strength is 210 g/2.5 cm.

The transparent conductive layer 3c, whose oxidation rate has been stated to be 93% in the above, is one provided for the purpose of improving the layer adherence to the base 2, and from this point of view this layer is desirable to be provided, but not essential in this invention. The layer 3c hardly affects the sheet resistance, light-transmissivity and adhesive strength.

Figure 12:
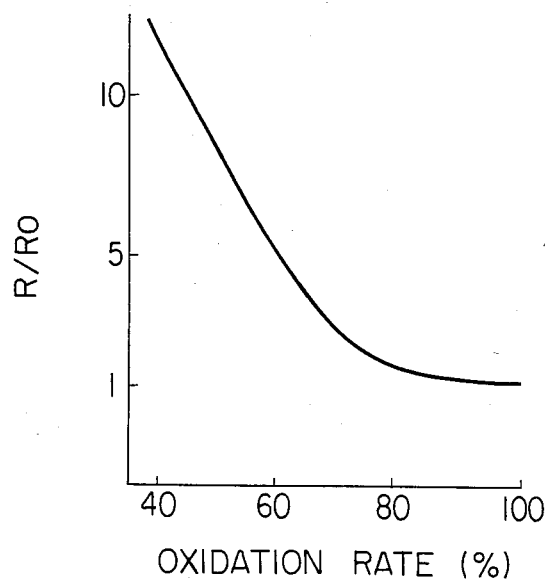

The relation between the oxidation rate of the transparent conductive layer to the base will now be explained. The adhesiveness was evaluated in an abrasion resistance test by use of gauze. The change in the sheet resistance R/Ro (Ro is the initial sheet resistance, and R is the sheet resistance after test) when the transparent conductive layer surface is reciprocatingly rubbed 100 times under pressure of 100 g/cm² was measured, and the obtained results are as shown in FIG. 12, provided that the transparent conductive layer forming condition is the same as that of the one used in the test by which the results in FIG. 2 was obtained.

As the adhesiveness becomes deteriorated, the contact resistance after test between the base and the transparent conductive layer increases, but as the oxidation rate becomes higher, the sheet resistance becomes closer to 1 (the change in the sheet resistance before and after test becomes smaller), and when the oxidation rate exceeds 87%, the change in the sheet resistance becomes extremely close to 1 (the difference in the sheet resistance between before and after test becomes very small).

From the above results it is understood that the presence of the foregoing layer 3c having an oxidation rate of 93% improves the adhesiveness of the transparent conductive layer to the base.

EXAMPLE 2

An evaporator for the deposition similar to that in Example 1 was used. The evaporation conditions in the evaporation cabinets 31a, 31b and 31c are as shown in the following Table 4.

TABLE 4

| | Oxygen gas pressure | High-frequency discharge power | Evaporation material | Thickness |
|---|---|---|---|---|
| Evaporation cabinet 31c | $7.5 \times 10^{-4}$ torr | 400 W | ITO (Sn 5%) Electron-gun heating | 300Å |
| Evaporation cabinet 31b | $7.5 \times 10^{-4}$ torr | 400 W | ITO (Sn 5%) Electron-gun heating | 300Å |
| Evaporation cabinet 31a | $4 \times 10^{-4}$ torr | 200 W | In resistance heating | 50Å |

The respective oxidation rates of the transparent conductive layers of the transparent conductive layer-built-up material are 80% for the layer 3c, also 80% (intrinsic oxidation rate of the transparent conductive layer) for the layer 3b, and 20% for the layer 3 (surface layer). On the base 2 are deposited two oxide layers different in the oxidation rate. The relation between the distance from the surface of the base 2 of this transparent conductive layer-built-up material and the oxidation rate is as shown in FIG. 11.

The sheet resistance of the transparent conductive layer-built-up material is 350Ω/□, the light-transmissivity is 84%, and the adhesive strength to the light emitting layer-provided layer-built-up material is 250 g/2.5 cm. In a transparent conductive layer-built-up material produced in the same manner as in Examples 1 and 2 except that the low-oxidation-rate layer 3a is excluded, the sheet resistance is 300Ω/□, the light-transmissivity is 83%, the adhesive strength to the light emitting layer-provided layer-built-up material is 120 g/2.5 cm.

As compared with this, both the transparent conductive layer-built-up materials of this invention in the foregoing Examples 1 and 2 show very strong adhesive strengths to the light emitting layer-provided layer-built-up material and very satisfactory sheet resistance and light-transmissivity values.

In addition, in the above examples, the component transparent conductive layers each has its own fixed oxidation rate, but the first layer 3c and the third layer 3a may also be settled so that their oxidation rates descend continuously or by stages in the opposite direction from the base 2 side, or alternatively the whole transparent conductive layer, without being clearly divided into three or two layers, may also be so composed that the oxidation rate descends continuously or in stages in the opposite direction from the base 2 side.

The low-oxidation-rate metal-oxide surface layer to be provided opposite to the base side of the transparent conductive layer may have thereon a metallic thin layer that is so thin (e.g., not more than 200 Å, particularly from 5 to 50 Å) as not adversely affect the light-transmissivity, the metallic thin layer being formed by being forcibly oxidized under the oxygen partial pressure control in the earlier-mentioned posttreatment. In this instance, the original metallic thin layer is allowed either to partially remain or to be overall oxidized.

The foregoing examples are ones relating to the transparent conductive layer-built-up material composed of a base and transparent conductive layers alone. However, the material may also have another layer such as, e.g., an ultraviolet absorbing layer, antireflection layer, water-trapping layer, or the like, between the base and the transparent conductive layers or on the reverse side of the base to the transparent conductive layers.

EXAMPLE 3

Figure 13:
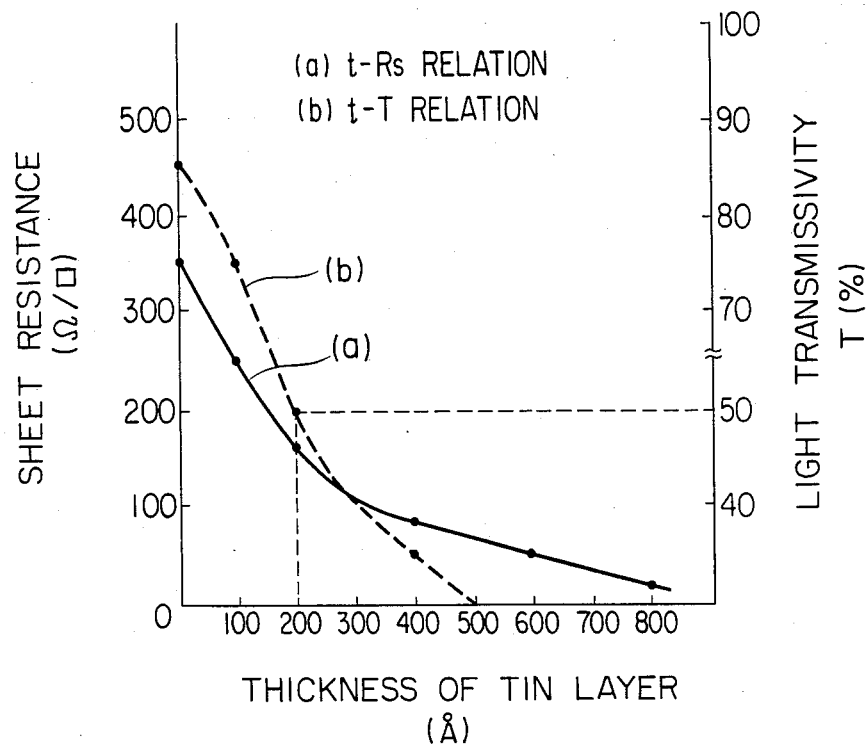

On a 75 μ-thick polyethylene terephthalate (PET) as the base 2 was formed a 500 Å-thick transparent conductive layer 3b comprised of an indium oxide-tin oxide mixture (ITO)(the proportion by weight of indium to tin is 95:5) by the DC reaction spattering with use of an ITO target or an indium-tin (ratio by weight of 90:10) alloy, and on this was further formed by the evaporation method a tin surface layer 3a in thicknesses varying from zero to 800 Å, thereby producing a transparent conductive layer-built-up material 1. The produced transparent conductive layer-built-up material was measured with respect to the sheet resistance and light-transmissivity thereof. Each thickness of the layer 3a was found by the calculation according to the evaporation rate indicator reading and evaporation time. As for the measurement and calculation of the thickness of the metallic layer, the same manner will apply also hereinafter. In addition, the evaporation/deposition of the surface layer 3a was made in a vacuum degree of from $10^{-5}$ Torr to $10^{-6}$ Torr, and, in the spattering, was made under a Ar gas pressure of $10^{-3}$ Torrs. The measured results are as shown in FIG. 13, wherein the respective points 0, 100, 200, 400, 600 and 800 Å in the thickness of the tin layer are the values of the comparative transparent conductive layer-built-up material.

From the figure it is understood that, if the thickness of the tin surface layer 3a is not more than 200 Å, a light-transmissivity of not less than 50% can be obtained. The sheet resistance rises with the decrease in the thickness of the tin layer 3a, but the sheet resistance will not exceed 1000Ω/□ no matter how the thickness of the layer 3a is reduced.

Figure 14:
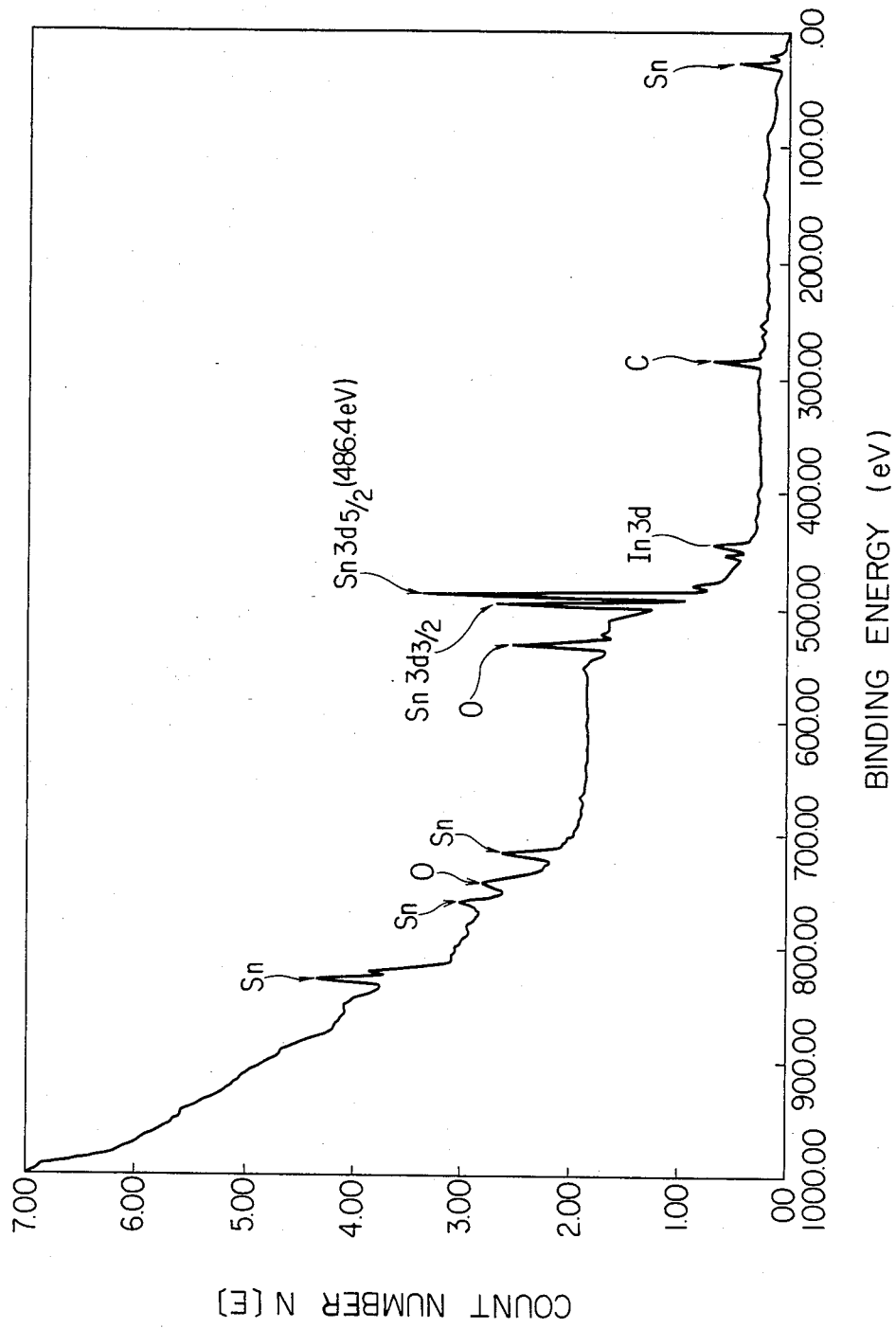

Further, a composition analysis of the surface of the transparent conductive layer-built-up material having the tin surface layer formed by the previously mentioned method was performed in accordance with the ESCA analysis. Since the binding energy of the tin layer thickness Sn3d5/2 is 486.4 eV as shown in FIG. 14, the tin layer is found out to have its surface in the tin-oxide condition. This is the naturally oxidized coat that metals usually have, and the thickness is several tens Å.

The metallic surface layer 3a in this invention is considered to have a naturally oxidized coat.

EXAMPLE 4

On a 0.2 mm-thick aluminum plate 6 was formed a several micrometer-thick layer by wire-bar coating and drying a $BaTiO_3$ powder-dispersed resin, and on this was further formed a layer by coating and drying a coating liquid prepared by dispersing zinc sulfide and manganese powder into a cellulose-type resin (in this example, cyanoethylated cellulose was used), thereby producing a several tens micrometer-thick light emitting layerprovided layer-built-up material 5 (see FIG. 4). The light emitting layer, because of being formed with the powder-dispersed layer as mentioned above, has a several tens micrometerdeep unevenness surface.

This light emitting layer-provided layer-built-up material 5 and a transparent conductive layer-built-up material 1 prepared in the same manner as in Example 3 (provided that the thickness of the tin surface layer 3a is 20 Å) were joined so that the surface layer 3a comes into contact with the light emitting layer 8, and heated to be made adhere to each other by pressure rollers 9 so as to become an integrated unit, whereby an electroluminescent display unit was obtained, provided that the applied roller pressure is 1 kg/cm, the roller temperature is 150° C., and the width of both the transparent conductive layer-built-up material 1 and the light emitting layer-provided layer-built-up material 5 is 2.5 cm. The sheet resistance of the transparent conductive layer-built-up material is 330Ω/□, and the light-transmissivity of the same is 82%.

The thus obtained electroluminescent display unit was measured with respect to the adhesive strength thereof in the above sticked portion by means of a "Tensilon UTM-III" 180° peel tester, manufactured by Toyo Measuring Instrument Co., Ltd. The outline of the measuring method, as shown in FIG. 5, is such that the transparent conductive layer-built-up material 1, with an end of the light emitting layer-provided layer-built-up material 5 being fixed, is pulled in the direction of 180° to thereby peel both apart, and the relation between the tensile distance and the load required for the peeling, i.e., the adhesive strength, is found.

Figure 15:
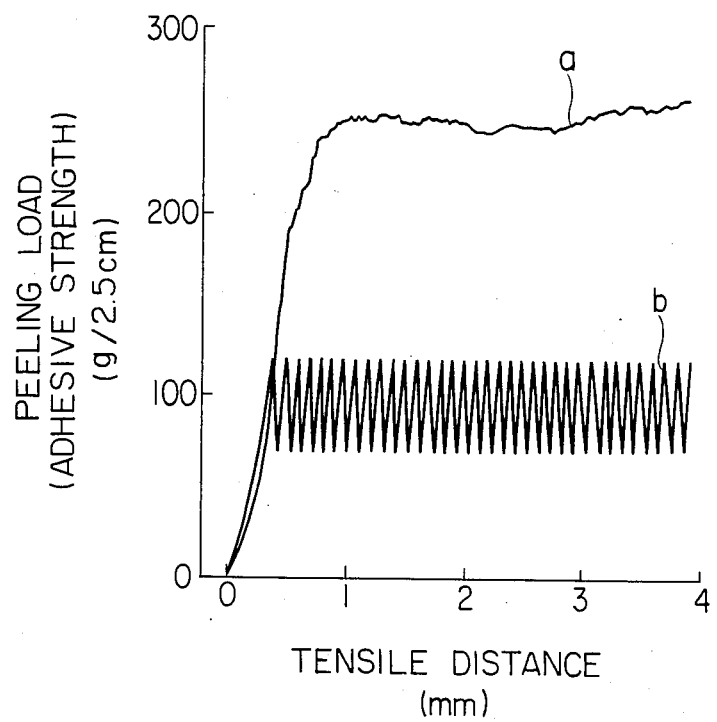

The obtained test results are as seen in the curve a of FIG. 15. At a tensile distance of less than 1 mm the peeling load is very small, but is not true value because this is due to the play in the chuck section (not shown) of the tester.

In this figure, for comparison, a curve b is also shown which represents the results obtained when testing in like manner an electroluminescent display unit that was prepared in the same manner as in this example except that no surface layer 3a was provided.

In the electroluminescent display unit comprising the comparative transparent conductive layer-built-up material, the adhesive strength varies from 70 to 120 g/2.5 cm, which is unacceptable. In contrast, the electroluminescent display unit comprising the transparent conductive layer based on this invention has an adhesive strength of about 250 g/2.5 cm, which is acceptable as an adequate adhesive strength.

Subsequently, the following Examples 5 through 12 will be explained in which the same test as in the above example was performed with varying the type of the transparent conductive layer and the material and thickness of the metallic layer. The base, the light emitting layer-provided layer-built-up material, and the adhesion method which were used in the following examples are the same as in Example 4.

EXAMPLE 5

Figure 16:
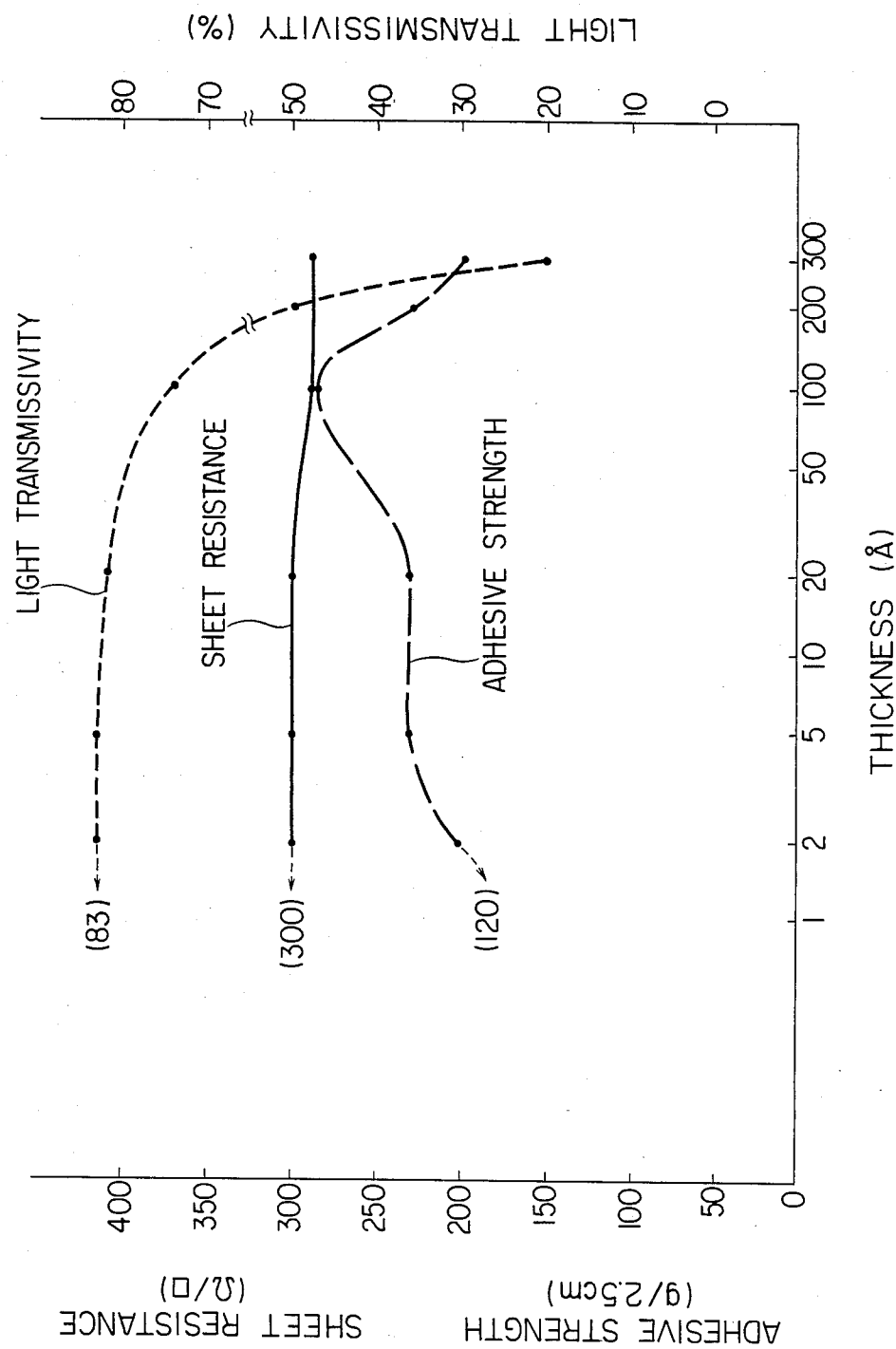

A display unit comprising ITO as the transparent conductive layer having a thickness of about 500 Å and a metallic surface layer composed of indium having a thickness of from zero to 300 Å was measured in the same manner as in Example 4 with respect to the sheet resistance, light-transmissivity, and adhesive strength. The results are as shown in FIG. 16, provided, however, the values in the case where the metallic layer is not provided (thickness is 0 Å), because they are unable to be plotted, are shown in parentheses with broken-lined arrows (the same will apply hereinafter). Further, these values and those plotted at the point exceeding 200 Å are the values of a comparative example (the same will apply hereinafter).

EXAMPLE 6

Figure 17:
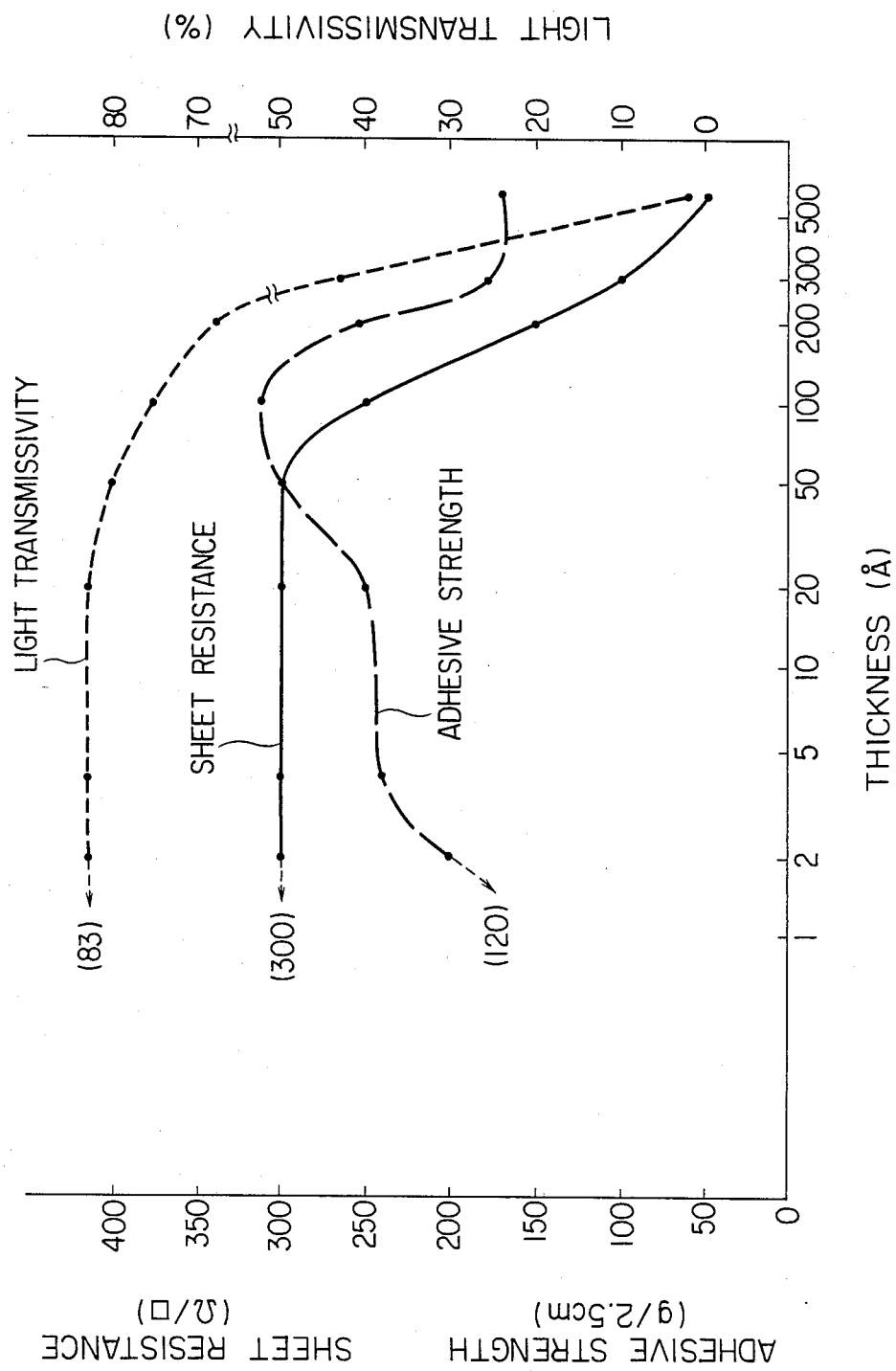

A display unit prepared in the same way as in the above Example 5 except that tin was used as the material for the metallic layer and the thickness thereof was made from zero to 600 Å was measured. The results are as shown in FIG. 17.

EXAMPLE 7

Figure 18:
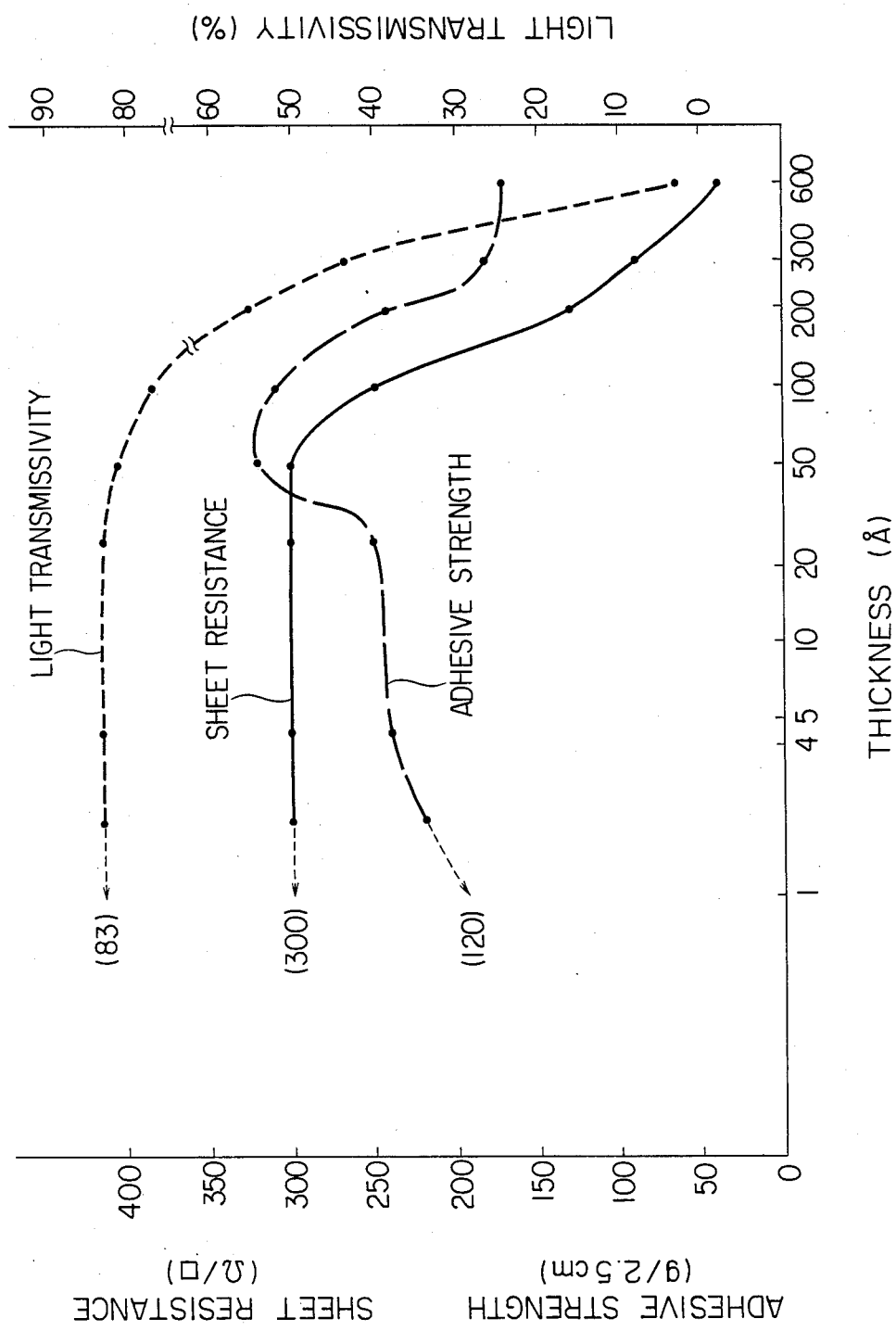

A display unit prepared in the same way as in Example 5 except that aluminum was used as the material for the metallic layer and the thickness thereof was made from zero to 600 Å was measured. The results are as shown in FIG. 18.

EXAMPLE 8

Figure 19:
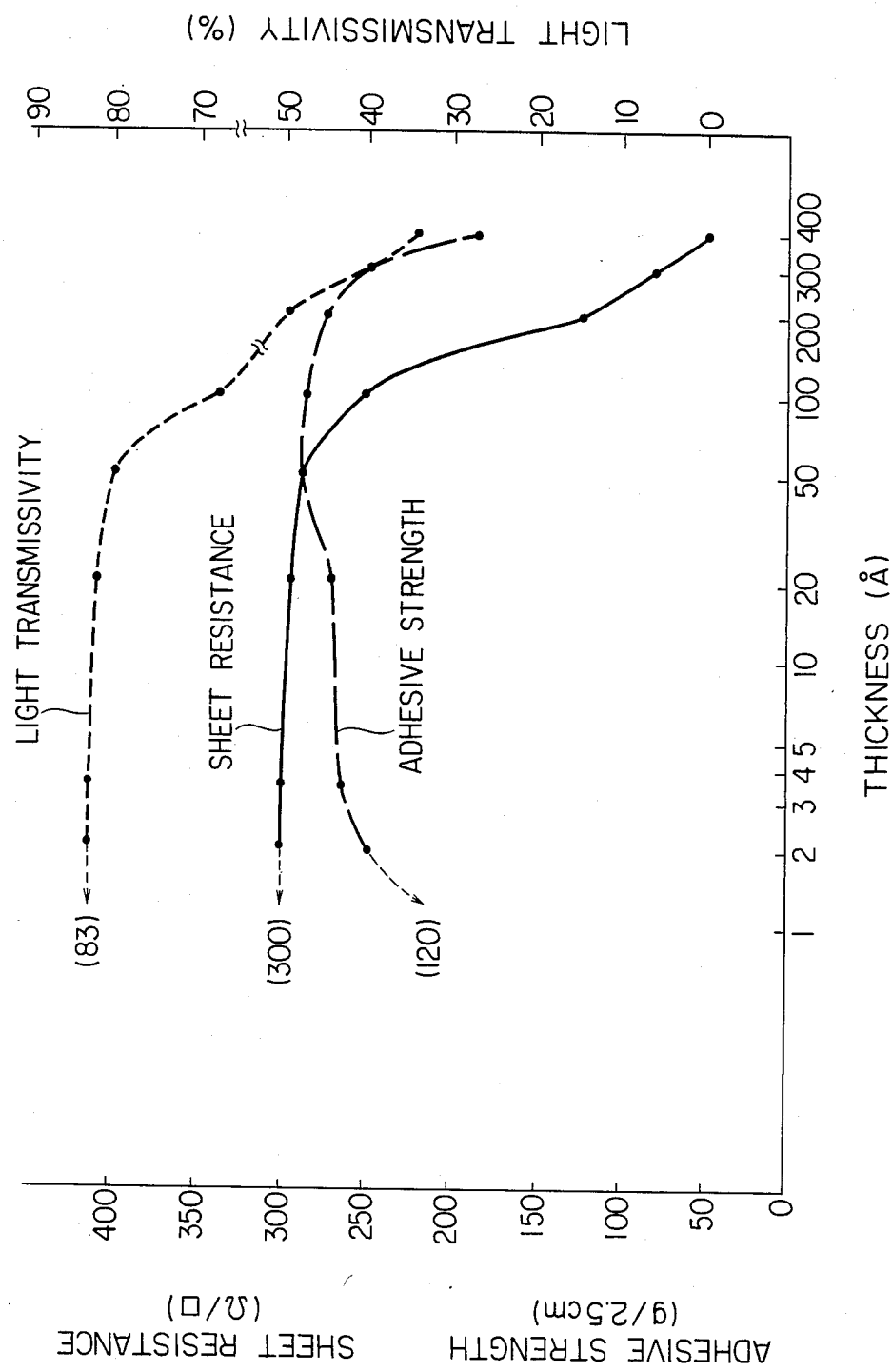

A display unit prepared in the same manner as in Example 5 except that copper was used as the material for the metallic layer and the thickness thereof was made from zero to 400 Å was measured. The results are as shown in FIG. 19.

EXAMPLE 9

Figure 20:
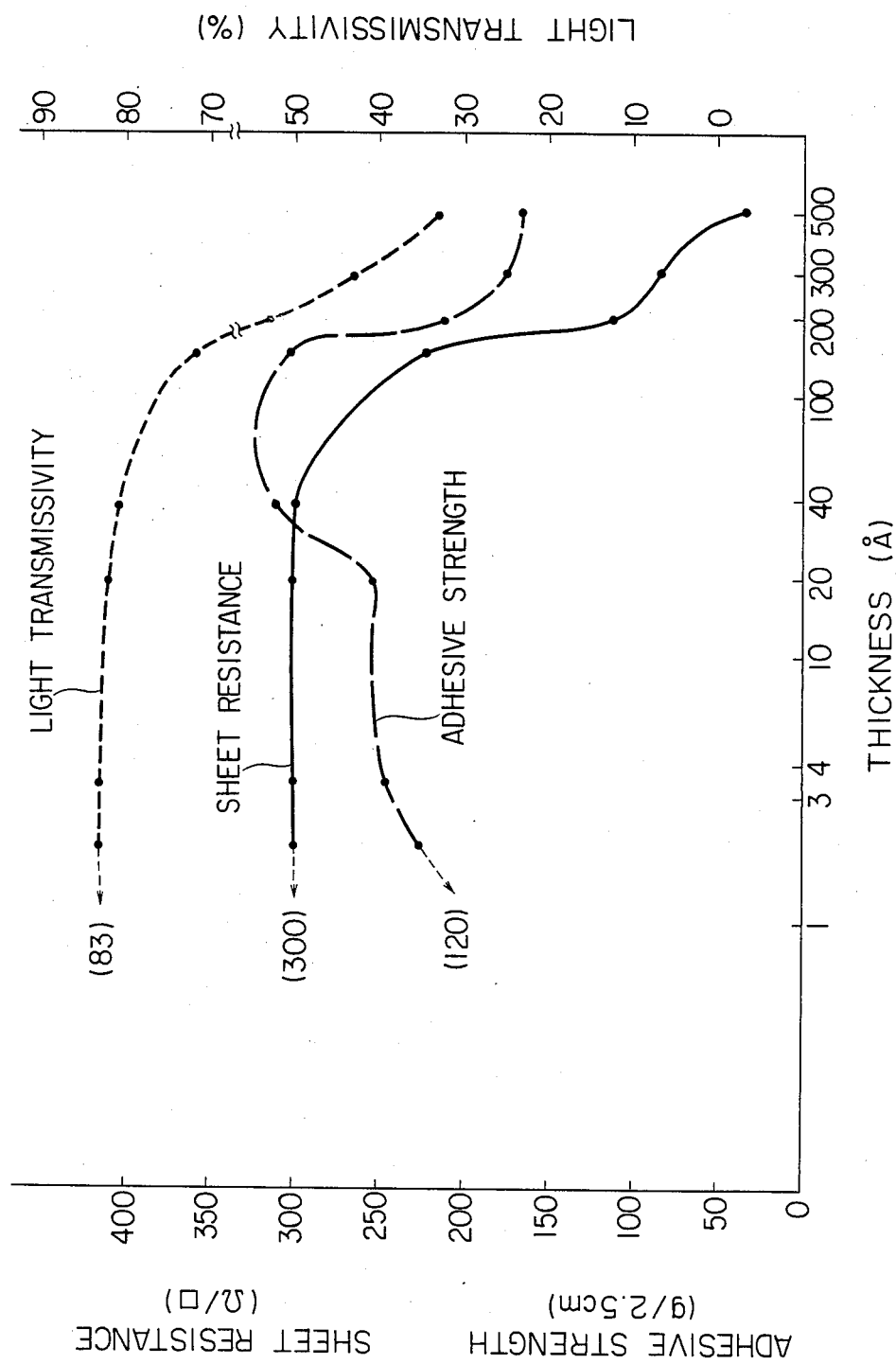

A display unit prepared in the same manner as in Example 5 except that chromium was used as the material for the metallic layer, the thickness thereof was made from zero to 500 Å, and the formation of the metallic layer was carried out by the spattering method was measured. The results are as shown in FIG. 20.

EXAMPLE 10

Figure 21:
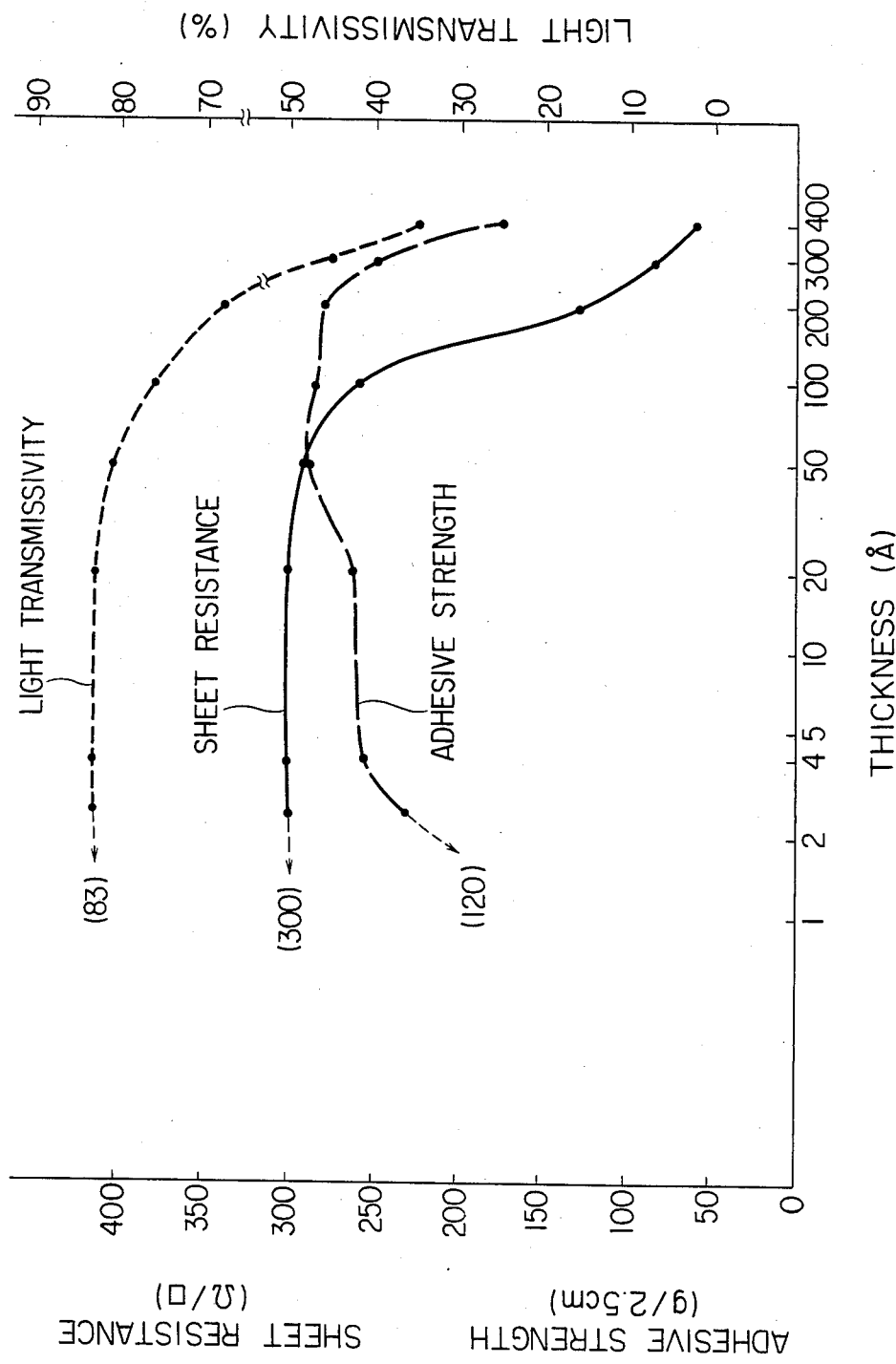

A display unit prepared in the same way as in Example 9 except that palladium was used as the material for the metallic layer and the thickness thereof was made from zero to 400 Å was measured. The results are as shown in FIG. 21.

EXAMPLE 11

Figure 22:
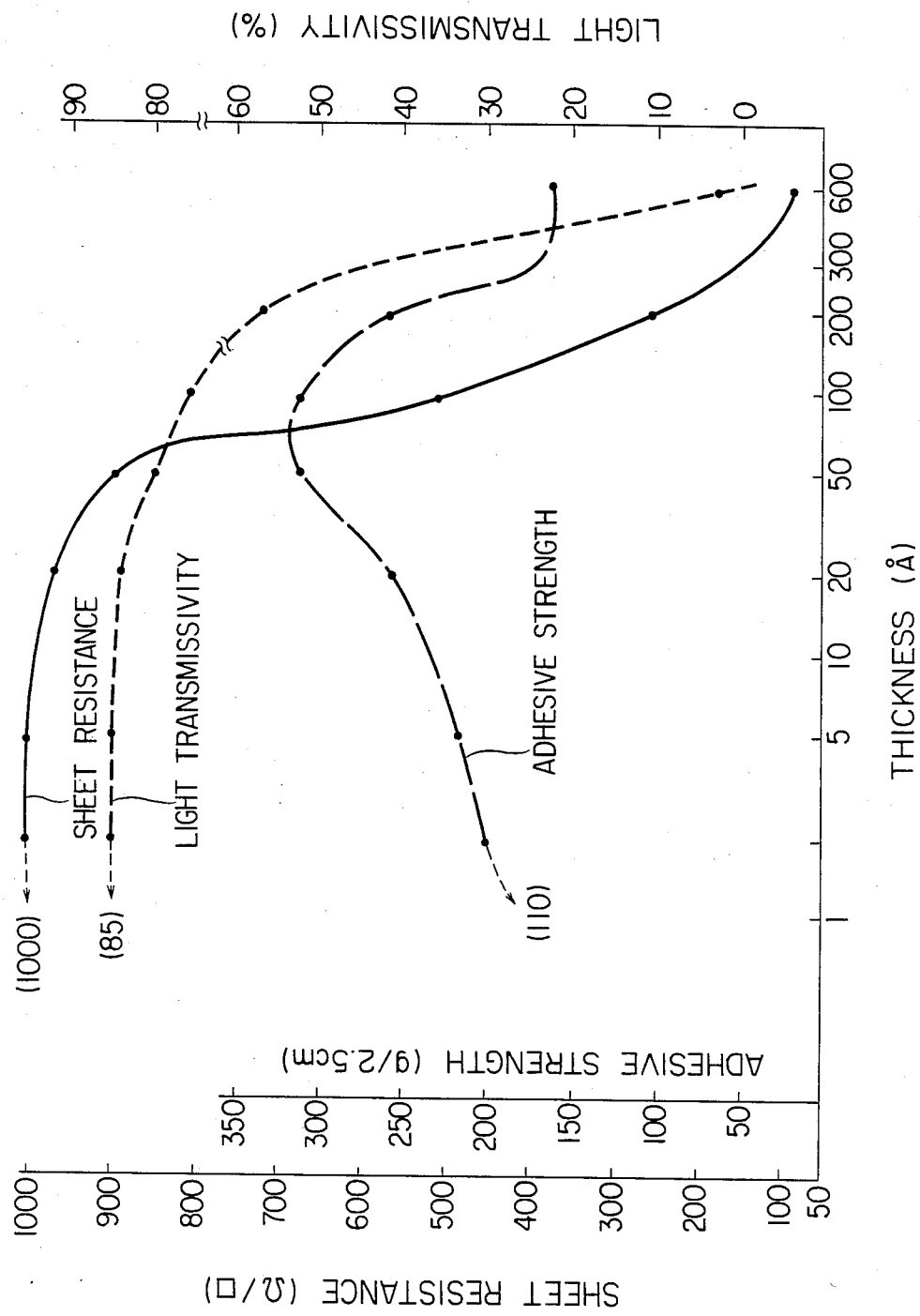

A display unit prepared in the same way as in Example 6 except that a 700 Å-thick transparent conductive layer composed of a tin oxide-antimony mixture (containing 2% by weight antimony) was formed by the DC reaction spattering method was measured. The results are as shown in FIG. 22.

EXAMPLE 12

Figure 23:
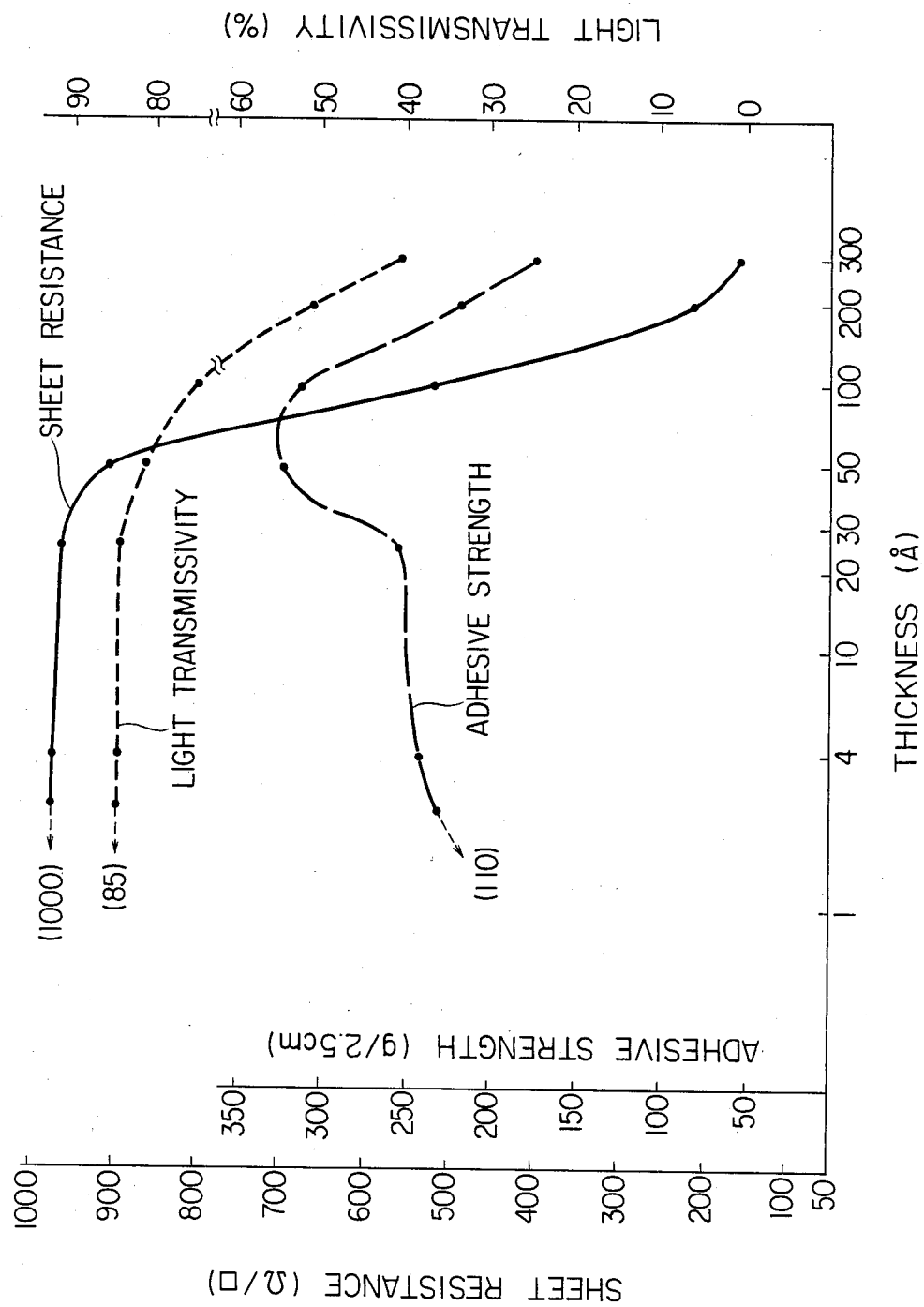

A display unit prepared in the same way as in Example 7 except that the transparent conductive layer was prepared in the same manner as in Example 11, provided that the thickness of aluminum was made from zero to 300 Å was measured. The results are as shown in FIG. 23.

All the results of the above Examples 5 through 12 are given together in the following Table 5.

TABLE 5

| | Transparent conductive layer | Metallic surface layer Material | Metallic surface layer Thickness (Å) | Sheet resistance ($\Omega/\square$) | Transmissivity (%) | Adhesive strength (g/2.5 cm) | Evaluation |
|---|---|---|---|---|---|---|---|
| Example 5 | Indium oxide-tin mixture Thickness about 500Å | In | 0 | 300 | 83 | 120 | x |
| | | | 2 | 300 | 83 | 200 | o |
| | | | 5 | 300 | 83 | 230 | o |
| | | | 20 | 300 | 82 | 230 | o |
| | | | 100 | 290 | 75 | 283 | o |
| | | | 200 | 290 | 50 | 230 | o |
| | | | 300 | 290 | 20 | 199 | x |
| Example 6 | Indium oxide-tin mixture Thickness about 500Å | Sn | 2 | 300 | 83 | 200 | o |
| | | | 5 | 300 | 83 | 240 | o |
| | | | 20 | 300 | 83 | 250 | o |
| | | | 50 | 300 | 80 | 300 | o |
| | | | 100 | 250 | 75 | 312 | o |
| | | | 200 | 150 | 58 | 254 | o |
| | | | 300 | 100 | 43 | 178 | x |
| | | | 600 | 50 | 2 | 170 | x |
| Example 7 | Indium oxide-tin mixture Thickness about 500Å | Al | 2 | 300 | 83 | 220 | o |
| | | | 4.5 | 300 | 83 | 240 | o |
| | | | 25 | 300 | 83 | 250 | o |
| | | | 50 | 300 | 81 | 320 | o |
| | | | 100 | 250 | 77 | 310 | o |
| | | | 200 | 130 | 55 | 215 | o |
| | | | 300 | 90 | 44 | 182 | x |
| | | | 600 | 40 | 3 | 172 | x |
| Example 8 | Indium oxide-tin mixture Thickness about 500Å | Cu | 2 | 300 | 83 | 250 | o |
| | | | 3.5 | 300 | 83 | 265 | o |
| | | | 20 | 295 | 82 | 272 | o |
| | | | 50 | 290 | 80 | 291 | o |
| | | | 100 | 255 | 75 | 289 | o |
| | | | 200 | 128 | 50 | 278 | o |
| | | | 300 | 85 | 41 | 253 | x |
| | | | 400 | 55 | 35 | 190 | x |
| Example 9 | Indium oxide-tin mixture Thickness about 500Å | Cr | 2 | 300 | 83 | 225 | o |
| | | | 3.5 | 300 | 83 | 245 | o |
| | | | 20 | 300 | 82 | 253 | o |
| | | | 40 | 300 | 81 | 312 | o |
| | | | 150 | 223 | 72 | 303 | o |
| | | | 200 | 113 | 53 | 213 | o |
| | | | 300 | 85 | 43 | 176 | x |
| | | | 500 | 34 | 33 | 167 | x |
| Example 10 | Indium oxide-tin mixture Thickness about 500Å | Pd | 3 | 300 | 83 | 230 | o |
| | | | 4 | 300 | 83 | 255 | o |
| | | | 20 | 300 | 83 | 263 | o |
| | | | 50 | 293 | 81 | 290 | o |
| | | | 100 | 260 | 76 | 286 | o |
| | | | 200 | 130 | 58 | 280 | o |
| | | | 300 | 87 | 45 | 250 | x |
| | | | 400 | 60 | 35 | 175 | x |
| Example 11 | Indium oxide-antimony mixture Thickness about 700Å | Sn | 0 | 1000 | 85 | 110 | x |
| | | | 2 | 1000 | 85 | 200 | o |
| | | | 5 | 1000 | 85 | 215 | o |
| | | | 20 | 950 | 84 | 255 | o |
| | | | 50 | 900 | 80 | 310 | o |
| | | | 100 | 500 | 76 | 311 | o |
| | | | 200 | 245 | 57 | 253 | o |
| | | | 300 | 165 | 44 | 170 | x |
| | | | 600 | 80 | 4 | 160 | x |
| Example 12 | Indium oxide-antimony mixture Thickness about 700Å | Al | 3 | 975 | 84 | 230 | o |
| | | | 4 | 970 | 84 | 243 | o |
| | | | 25 | 960 | 84 | 255 | o |
| | | | 50 | 910 | 81 | 322 | o |
| | | | 100 | 513 | 75 | 313 | o |
| | | | 200 | 215 | 52 | 218 | o |

TABLE 5-continued

| Transparent conductive layer | Metallic surface layer | | Sheet resistance ($\Omega/\square$) | Transmissivity (%) | Adhesive strength (g/2.5 cm) | Evaluation |
|---|---|---|---|---|---|---|
| | Material | Thickness (Å) | | | | |
| | | 300 | 160 | 41 | 175 | x |

Note:
The 0Å in the "Thickness (Å)" column of the "Surface layer" is of comparative example having no surface layer.
The mark "o" in the "Evaluation" column represents being acceptable as the transparent conductive layer-built-up material, while the "x" represents being unacceptable as the transparent conductive layer-built-up material.

From the results of the above Examples 5 through 12 the following things can be understood:

(1) If the thickness of the metallic surface layer exceeds a certain value, the light-transmissivity lowers, but if the thickness is not more than 200 Å, a light-transmissivity of not less than 50% can be maintained; if it is not more than 100 Å, a light-transmissivity of not less than 75%; and if it is not more than 50 Å, a light-transmissivity of not less than 80% can be maintained.

(2) As the metallic surface layer becomes thinner, the sheet resistance increases, but however thin the metallic surface layer is, a sheet resistance of not more than 1000Ω/□ can be maintained.

(3) The adhesive strength shows its maximum value when the thickness of the metallic surface layer is in the range of 50–100 Å. If the metallic surface layer becomes thicker exceeding this thickness range, the adhesive strength lowers. But, as long as the thickness is in the range of up to 200 Å, an adhesive strength of not less than 200 g/2.5 cm can be maintained. However, because the change in the adhesive strength is very small when the thickness of the metallic surface layer is in the range of 2.5–5 Å or 20–25 Å, the thickness of the metallic surface layer should be not less than 3 Å, and particularly preferably not less than 5 Å.

On the other hand, from the standpoint of the above light-transmissivity, the thickness of the metallic surface layer is particularly desirable to be in the range of 5–50 Å.

The reason why the adhesive strength increases with the increase in the thickness of the metallic surface layer and lowers after showing its maximum value is considered as follows.

In order to make the transparent conductive layer-built-up material strongly adhere to the light emitting layer-provided layer-built-up material, the following two requirements must be met:

(a) The affinity between both layers (the wettability of both layers when the light emitting layer is softened by the heat of heat rollers) needs to be satisfactory, and (b) the contact area between both layers needs to be large.

Incidentally, (1) in the case where the light emitting layer and the transparent conductive layer are made adhere directly to each other without providing a metallic surface layer on the transparent conductive layer-built-up material, the transparent conductive layer-built-up material is so flexible that the contact area thereof with the rough surface of the light emitting layer can be maintained large when undergoing the roller pressure, but because the transparent conductive layer is formed under a highly oxidized condition, the affinity with the light emitting layer is not adequate, so that both layers can not stick strongly to each other;

(2) in the case where the transparent conductive layer having thereon an appropriately thick metallic surface layer is made adhere to the light emitting layer, because the flexibility of the transparent conductive layer-built-up material is hardly deteriorated, the contact area thereof with the rough surface of the light emitting layer can be maintained large, and further because the affinity or the like nature of the light emitting layer to the metallic surface layer at the time of sticking by pressure and heating is adequate, both layers can strongly stick to each other;

(3) even though a metallic surface layer is provided on the transparent conductive layer, if the surface layer is too thin, the formation of the metallic surface layer becomes incomplete, causing partial vacancy of the metallic surface layer, so that the above effect by the presence of the metallic surface layer is not adequately exhibited, or the formed metallic surface layer shows almost no complete adhesiveness to the transparent conductive layer to cause the metallic surface layer to be easily peeled from the transparent conductive layer, thus deteriorating the adhesive strength, and (4) if the metallic surface layer is too thick, the transparent conductive layer-built-up material loses its flexibility to become unable to maintain large the contact area thereof with the rough surface of the light emitting layer, and thus the adhesive strength is deteriorated.

In addition, aside from the above Examples 5 through 12, the results obtained in examples where the formation of the metallic surface layer was performed by the spattering method and the following materials were used as the material for the metallic surface layer are as given below:

When cadmium and zinc were used as the material for the metallic surface layer, the results were almost the same as those obtained when tin was used, while when titanium, antimony, tungsten, platinum, gold, silver, molybdenum, tantalum and nickel were used as the material for the metallic surface layer, the results were almost the same as those obtained when chromium or palladium was used.

The above examples 3 through 12 are examples where a metallic surface layer is provided overall on the entire surface of the transparent conductive layer, but the metallic surface layer may also be provided in a range enough to meet the foregoing adhesive strength (e.g. more than 50% of the surface of the transparent conductive layer).

The foregoing Examples 3 through 12 are ones relating to the transparent conductive layer-built-up material comprised of base, transparent conductive layer, and metallic layer alone, but other layers such as, for example, ultraviolet layer, antireflection layer, water-trapping layer, etc., may also be provided between the base and the transparent conductive layer, or between the transparent conductive layer and the metallic layer, or on the reverse side of the base to the transparent conductive layer. And in the case where the material for the metallic surface layer is, for example, aluminum, on the surface of the metallic layer is formed a thin alumina layer due to natural oxidation, but the presence of such a thin oxidized coat causes no troubles at all because it by no means adversely affects the sheet resistance, light-transmissivity and adhesive strength.

What is claimed is:

1. A transparent conductive device comprising a support and a transparent conductive layer comprising a metal oxide, wherein said device has a surface layer comprising a metal or an oxide thereof on said transparent conductive layer on the side opposite to said support and which degree of oxidation is lower than that of said transparent conductive layer.

2. The transparent conductive device of claim 1, wherein said degree of oxidation of said surface layer is less than 67%.

3. The transparent conductive device of claim 2, wherein the thickness of said surface layer is less than 200 Å.

4. The transparent conductive device of claim 1, wherein said metal oxide of said transparent conductive layer selected from the group consistng of Indium oxide, Tin oxide, Cadmium oxide, Antimony oxide, Indium-Tin oxide and Tin-Antimony oxide.

5. The transparent conductive device of claim 1, wherein said metal or oxide thereof forming said surface layer is selected from the group consistng of In, Sn, Cd, Zn, Ti, Sb, Al, W, Mo, Cr, Ta, Ni, Pt, Au, Ag, Cu, Pd and oxide of them.

6. The transparent conductive device of claim 4, wherein said metal oxide is Indium-Tin oxide.

7. The transparent conductive device of claim 5, wherein said surface layer consisting essentially of Indium-Tin oxide.

8. The transparent conductive device of claim 1, wherein said surface layer is formed by vacuum evaporation or sputtering of on metal.

9. The transparent conductive device of claim 2, wherein said degree of oxidation is higher than 13%.

10. The transparent conductive device of claim 9, wherein said degree of oxidation is in the range of from 27% to 53%.

11. The transparent conductive device of claim 1, wherein the degree of oxidation of said transparent conductive layer is in the range of from 67% to 87%.

* * * * *